United States Patent [19]

Barnes et al.

[11] Patent Number: 5,505,816
[45] Date of Patent: Apr. 9, 1996

[54] ETCHING OF SILICON DIOXIDE SELECTIVELY TO SILICON NITRIDE AND POLYSILICON

[75] Inventors: Michael S. Barnes, San Francisco, Calif.; John H. Keller, Poughkeepsie, N.Y.; William M. Holber, Boston, Mass.; Tina J. Cotler, Newburgh, N.Y.; Jonathan D. Chapple-Sokol, Poughkeepsie, N.Y.; Dragan Podlesnik, New York City, N.Y.

[73] Assignee: International Business Machines Corporation, Armonk, N.Y.

[21] Appl. No.: 168,887

[22] Filed: Dec. 16, 1993

[51] Int. Cl.$^6$ .................................................. H01L 21/00
[52] U.S. Cl. ........................ 156/662.1; 156/643.1; 156/646.1; 437/225
[58] Field of Search .................. 156/643.1, 646.1, 156/662.1; 437/225

[56] References Cited

U.S. PATENT DOCUMENTS

| | | | |
|---|---|---|---|
| 4,352,724 | 10/1982 | Sugishima et al. | 156/643 |
| 4,615,764 | 10/1986 | Bobbio et al. | 156/643 |
| 4,711,698 | 12/1987 | Douglas | 156/643 |
| 4,807,016 | 2/1989 | Douglas | 357/67 |
| 5,030,319 | 7/1991 | Nishino et al. | 156/635 |
| 5,122,225 | 6/1992 | Douglas | 156/643 |
| 5,128,744 | 7/1992 | Asano et al. | 357/54 |
| 5,173,151 | 12/1992 | Namose | 156/643 |
| 5,230,772 | 7/1993 | Kadomura | 156/643 |
| 5,282,925 | 2/1994 | Jeng et al. | 156/646 |

FOREIGN PATENT DOCUMENTS

| | | |
|---|---|---|
| 58-056317 | 4/1983 | Japan . |
| 59-033833 | 2/1984 | Japan . |

OTHER PUBLICATIONS

"Plasma Chemical Aspects of Magnetron Ion Etching with $CF_4/O_2$ and $CF_4/H_2$"; Plasma Processing and Synthesis of Materials; Material Research Soc; XVL; 1987; abstract only; Bright et al.

Primary Examiner—R. Bruce Breneman
Assistant Examiner—George Goudrean
Attorney, Agent, or Firm—Whitham, Curtis, Whitham & McGinn; Harold Huberfeld

[57] ABSTRACT

Silicon dioxide on a substrate is directionally etched using a hydrogen halide plasma which is created within an etch chamber. The method selectively etches silicon dioxide relative to polysilicon and silicon nitride. A substrate and the combination of $NH_3$ and $NF_3$ gases or the combination of $CF_4$ and $O_2$ gases mixed with $H_2$ and $N_2$ gases are located within an etch chamber. An electrical field is created within the etch chamber causing the gas mixture to form a plasma. The negative charge at the bottom of the chamber attracts the positively charged plasma, thereby etching the substrate in the downward direction. The result is an anisotropic product. The method is also shown to be effective in non-selectively etching thermal and deposited oxides, resulting in a similar etch rate for the different types of oxides.

15 Claims, 7 Drawing Sheets

ETCHING OF SILICON DIOXIDE SELECTIVELY TO SILICON NITRIDE AND POLYSILICON

BACKGROUND OF THE INVENTION

1. Field of the Invention

The present invention generally relates to a surface processing technique of a silicon wafer substrate. Particularly, this invention relates to a technique for directionally removing or dry etching of an oxide film, using a plasma of $NH_3$ and $NF_3$ or $CF_4$ and $O_2$ mixed with $H_2$ and $N_2$.

2. Description of the Prior Art

The exposure of a surface of a silicon (Si) substrate to ambient air causes a layer of native silicon dioxide ($SiO_2$) to form on its surface. The formation of the native $SiO_2$ layer presents certain manufacturing difficulties since many semiconductor processes, such as low-temperature epitaxy, polysilicon deposition, and silicidation, require the silicon wafer surface to be free of all native $SiO_2$. The prior art establishes that many different processes for etching or cleaning of the native $SiO_2$ from Si surfaces have been developed. One of the most commonly used techniques for etching $SiO_2$ is to expose the substrate to hydrofluoric acid (HF), either wet or dry. However, the use of liquid or vapor HF has major drawbacks for the semiconductor manufacturer because it is both highly toxic and highly corrosive. The high toxicity of HF requires the semiconductor manufacturer to implement safety procedures and devices which ensure that people and the environment are not injured by the HF gas. In addition, since HF is highly corrosive, it must be stored in containers and delivered to a cleaning or etch chamber in tubing which is resistant to corrosion. This type of equipment is generally more expensive than containers and tubing that do not possess anti-corrosive properties.

It is also known in the prior an to selectively etch silicon dioxide using mixtures of fluorocarbon gases. However, this technique is also problematic due to the reaction inhibiting polymer which forms when the silicon or silicon nitride substrate is exposed to the fluorocarbon gases. In this technique, when oxide film is present, the oxygen in the oxide film prevents the formation of a reaction inhibiting polymer. However, once the oxide is etched through, the reaction inhibiting polymer can form and is deposited on the silicon or silicon nitride, inhibiting the etching of these films. The reaction inhibiting polymer film is difficult to remove from the wafer. The polymer film can also passivate the chamber wall and electrode surfaces and is a source of particles. Finally, the etch selectivity, in this process, is under 20:1 for $SiO_2$ relative to polysilicon or silicon nitride.

The use of wet etching techniques, as described above, to remove a thermal or native oxide film also present problems due to the variation in the wet etch rates of different oxide films. There are many types of oxide films currently in use, with two common ones being thermal oxide and deposited tetraethylorthosilicate TEOS) oxide. The etch rate of these films can vary by a factor of three, with the thermal oxides being slower. Since each wet etch performed reduces the film thickness of any exposed deposited oxide in proportion to the etch rate milo, it is usually necessary to adjust the initial thickness of the deposited oxide. Therefore, it would be desirable for the deposited oxides to etch at the same or a lower rate than the thermal oxides.

Figure 1A:
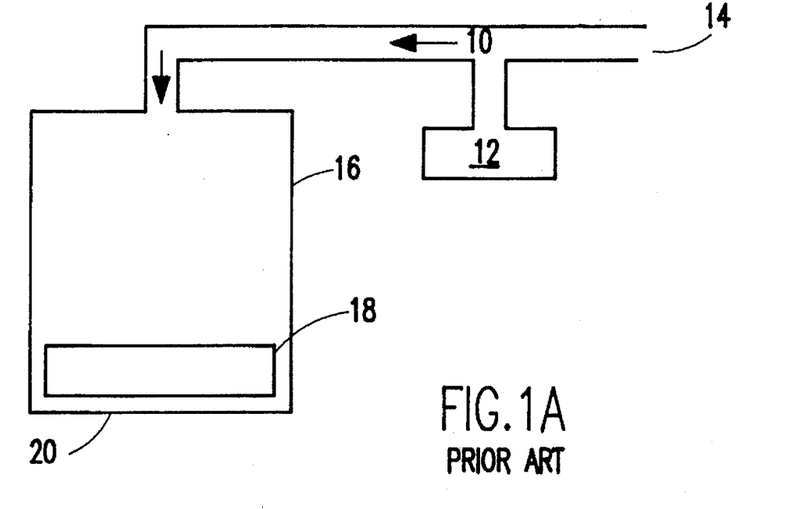
FIG. 1A illustrates the prior art etch chamber as disclosed in U.S. Pat. No. 5,030,319 to Nishino et al.

U.S. Pat. No. 5,030,319 to Nishino et al. and in the article to Nishino et al., 1989 *Dry Process Symposium IV*-2 90-92 (1989), discloses a method of selectively etching native $SiO_2$ from a silicon substrate using fluorine atoms and nitrogen hydrides produced by a $NH_3$ and $NF_3$ microwave discharge. This technique, as shown in FIG. 1A, discloses the use of a source 12 remotely positioned from etch chamber 16 to excite a gaseous $NH_3$ and $NF_3$ mixture into a plasma prior to its transport to the etch chamber 16. The substrate 18 is located on the floor 20 of etch chamber 16. The remote excitement of the gases causes the excited gases to randomly diffuse over the substrate which is to be etched. There is no directional control over the etching process. FIG. 2B provides an example of etching using this method. Since, the excited particles etch in all directions an isotropic product is created. As shown, the process is effective in etching to the surface of the substrate 52, but results in the undercutting of the wall 58 in the area beneath resist pattern 54 which should not to be etched. It is desirable for the etching product to have an anisotropic profile.

SUMMARY OF THE INVENTION

It is therefore an object of the present invention to use a gas mixture of $NH_3$ and $NF_3$ or $CF_4$ and $O_2$ mixed with $H_2$ and $N_2$ to provide an improved means for selectively etching silicon dioxide.

Another object of this invention is to provide a means for etching vias and trenches in $SiO_2$ with a high degree of anisotropy.

According to the invention, $SiO_2$ is selectively etched from a substrate using a plasma created from $NH_3$ and $NF_3$ gases, the substrate being located in an etch chamber where the plasma is formed. The creation of the $NH_3$ and $NF_3$ plasma within the etch chamber provides for enhanced directional etching capabilities and results in improved anisotropic etching of $SiO_2$. A field source is used to generate an electric field within the chamber and to excite the plasma. The creation of a negative charge at the bottom of the chamber forces the positive radicals in the downward direction towards the substrate. A passivation layer of ammonium hexafluorosilicate (AHFS) will be formed at the point where the plasma contacts exposed $SiO_2$. The lapse of a sufficient amount of time for the reaction allows the passivation layer to extend to the Si or silicon nitride etch stop layer. If desired, the passivation layer can be removed by either heating the passivation layer at a temperature greater than 100° C. or by rinsing the passivation layer with deionized water. The removal of the ammonium hexafluorosilicate passivation layer results in anisotropic trenches and vias in the $SiO_2$. It is also possible to leave the layer of AHFS in place and use this method for epitaxial growth pre-treatment or other process steps requiring an oxide free surface.

Furthermore, the use of the combination of $NH_3$ and $NF_3$ gases, as is disclosed in this application, provides a means for achieving the non-selective etching of different types of oxides, such as oxides deposited by TEOS, or by chemical vapor and doped oxides, such as phosphosilicate glass (PSG), thereby allowing a thermal oxide to be etched at approximately the same rate as a deposited oxide.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1B:
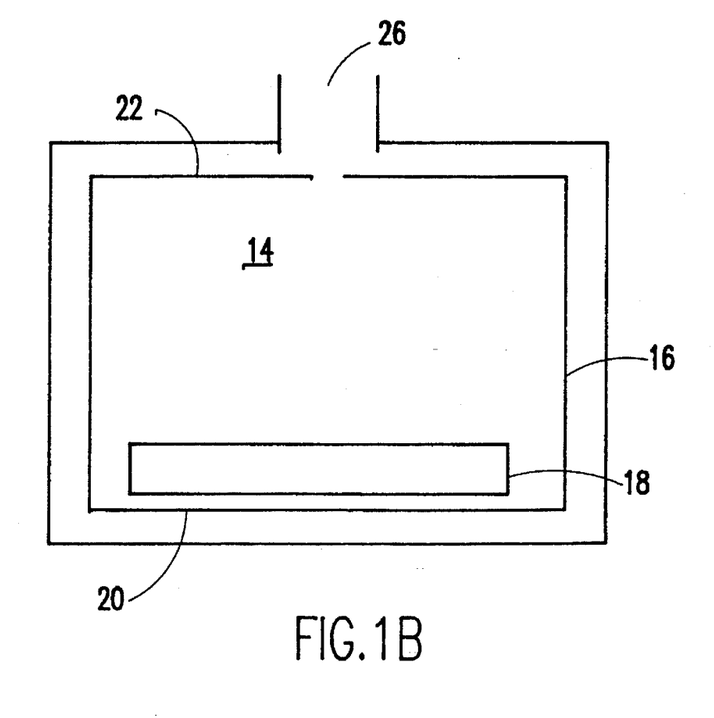
FIG. 1B is a schematic drawing of the etch chamber of the present invention.

Referring now to the drawings, and more particularly to FIG. 1B, the invention is directed to the selective etching of silicon dioxide, wherein a gaseous mixture of $NH_3$ and $NF_3$ 14 is formed in the chamber 16 where the substrate 18 is located. It is also possible to use the combination of $CF_4$ and $O_2$ mixed with $H_2$ and $N_2$ as a substitute for the $NH_3$ and $NF_3$ gas mixture. This process is also shown to be non-selective with respect to the etching of different oxides. A power source 26 is used to create an electrical field within the chamber 16, thereby exciting the gaseous mixture of $NH_3$ and $NF_3$ to create a plasma of $NH_4F$ and similar radicals. The plasma created has fields within the plasma and a sheath above the substrate 18, thereby accelerating the ions, such as $NH_4^+$ or any ion containing N, H or F, downward onto the substrate surface. The reaction of the radicals and ions with the $SiO_2$ layer converts the layer to ammonium hexafluorosilicate (AHFS), $(NH_4)_2SiF_6$. If desired, as in a selective oxide etch application, the ammonium hexafluorosilicate can easily be removed by heating to a temperature of 100° C. or by rinsing with deionized water. This results in the release of $NH_3$, HF and $SiF_4$. However, it is also possible to leave the passivating product layer in place and use it as a pre-treatment for epitaxial growth or other process steps requiring an oxide free surface.

Figure 2A:
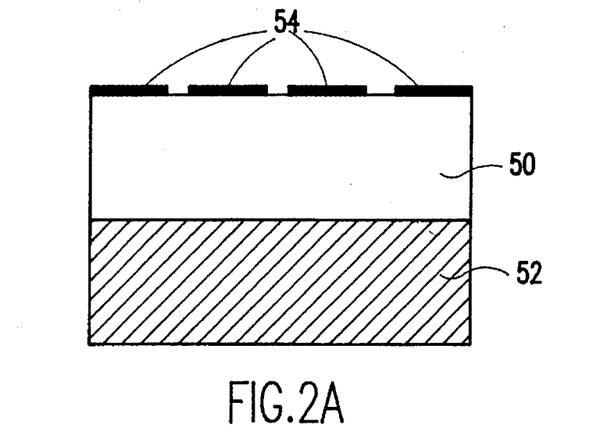
FIG. 2A depicts a substrate with a silicon dioxide layer.
Figure 2B:
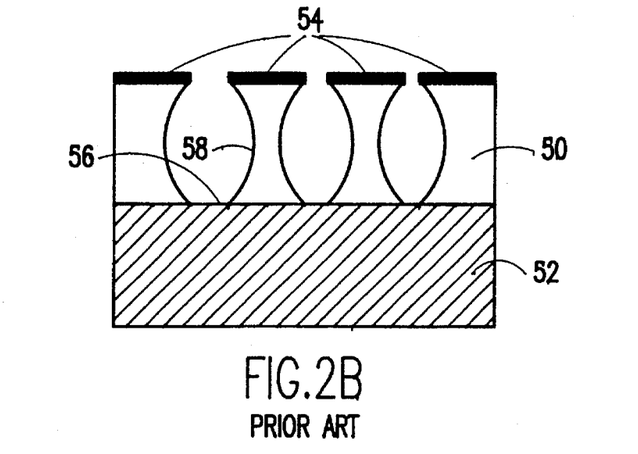
FIG. 2B illustrates isotropic etching of the substrate depicted in FIG. 2A when using the prior art technique and apparatus as depicted in FIG. 1A.

FIG. 2A illustrates a substrate 52 with a $SiO_2$ layer 50 prior to the etching to the substrate. A resist pattern 54 has been created on the $SiO_2$ layer 50 in preparation for selective etching.

Figure 2C:
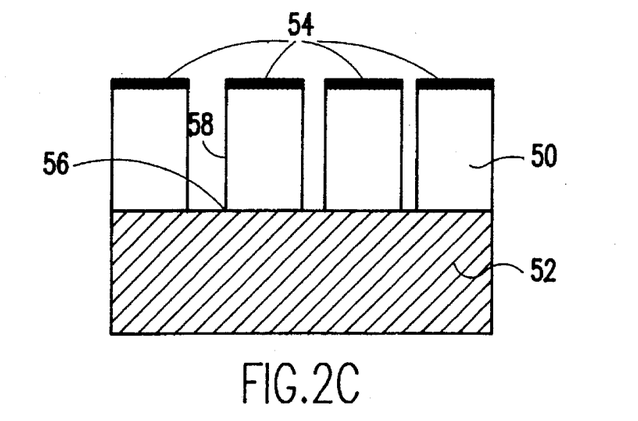
FIG. 2C is a schematic drawing of anisotropic etching of the substrate depicted in FIG. 2A when using the technique and apparatus of this invention depicted in FIG. 1B.

FIG. 2C illustrates the resulting product after it has been etched using the method and apparatus of this invention. As shown, an anisotropic product is created, with the silicon dioxide 50 being etched straight down to the substrate surface 56. The selective etching of the silicon dioxide results in the formation of straight walls 58 which do not extend beneath the desired resist pattern 54. The selective etching shown results from the directional control provided by exciting the $NF_3$ and $NH_3$ gas mixture within the etch chamber.

Figure 3:
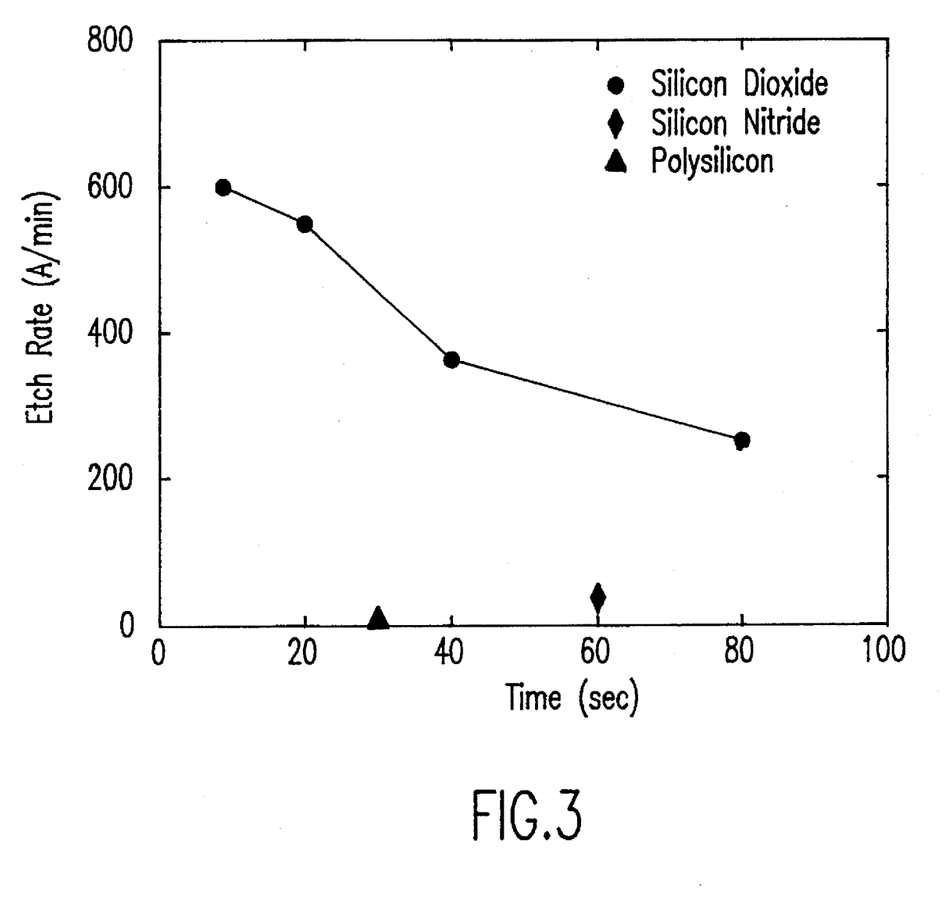
FIG. 3 is a graph which shows the respective etch rates of silicon dioxide, polysilicon and silicon nitride when exposed to a plasma of $NH_3$ and $NF_3$.

The graph shown in FIG. 3, provides a comparison of the etch rates of silicon dioxide, silicon nitride and polysilicon and illustrates the variance in the etch rate over time. As can be interpreted from this graph, a selectivity of greater than fifty (50) for silicon dioxide over polysilicon and of greater than five (5) for silicon dioxide over silicon nitride have been achieved.

Figure 4A:
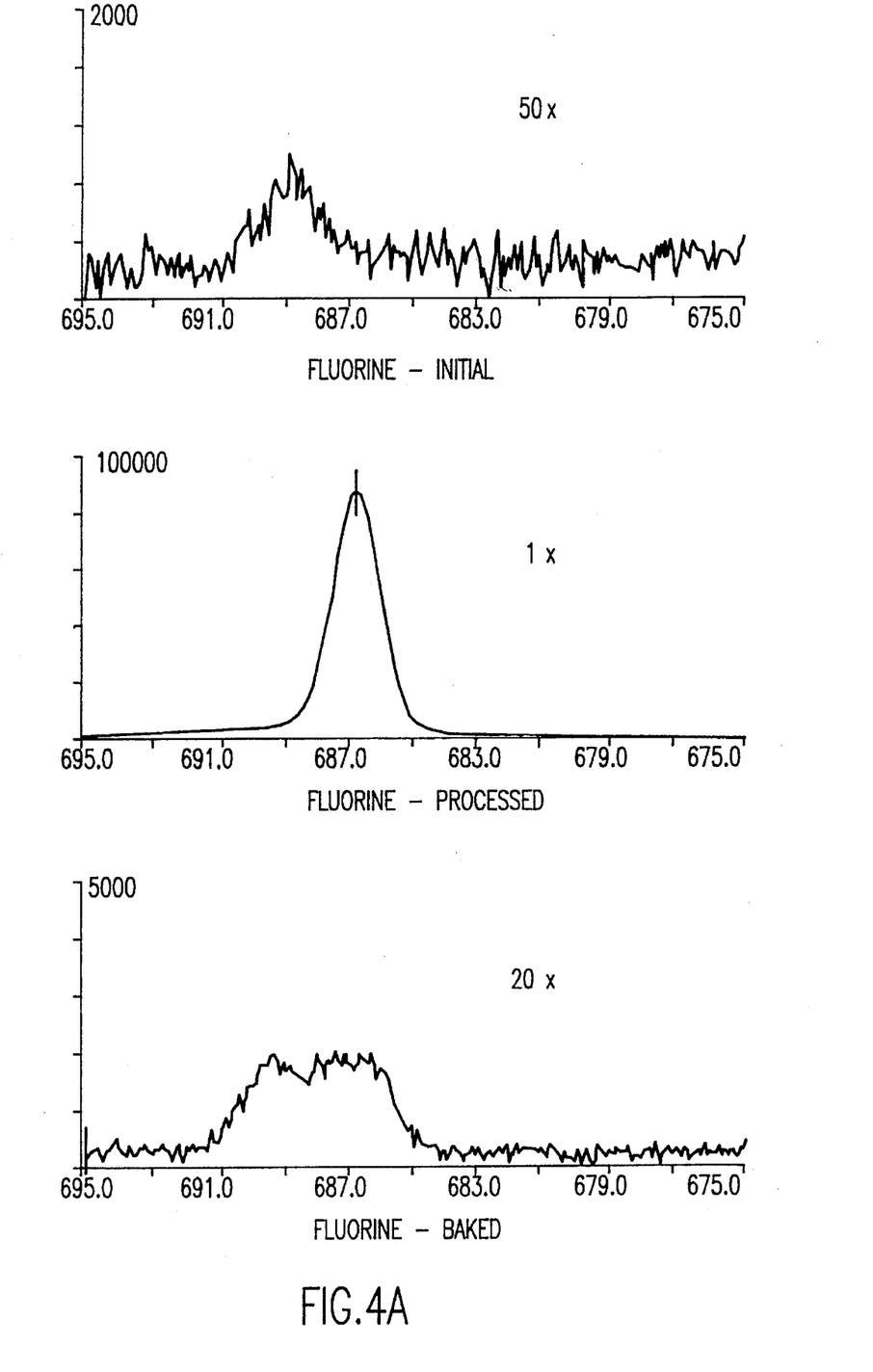
FIGS. 4A, 4B and 4C are examples is an example of an XPS analysis which demonstrates the effective removal of native oxide achieved by the method of the present invention.
Figure 4B:
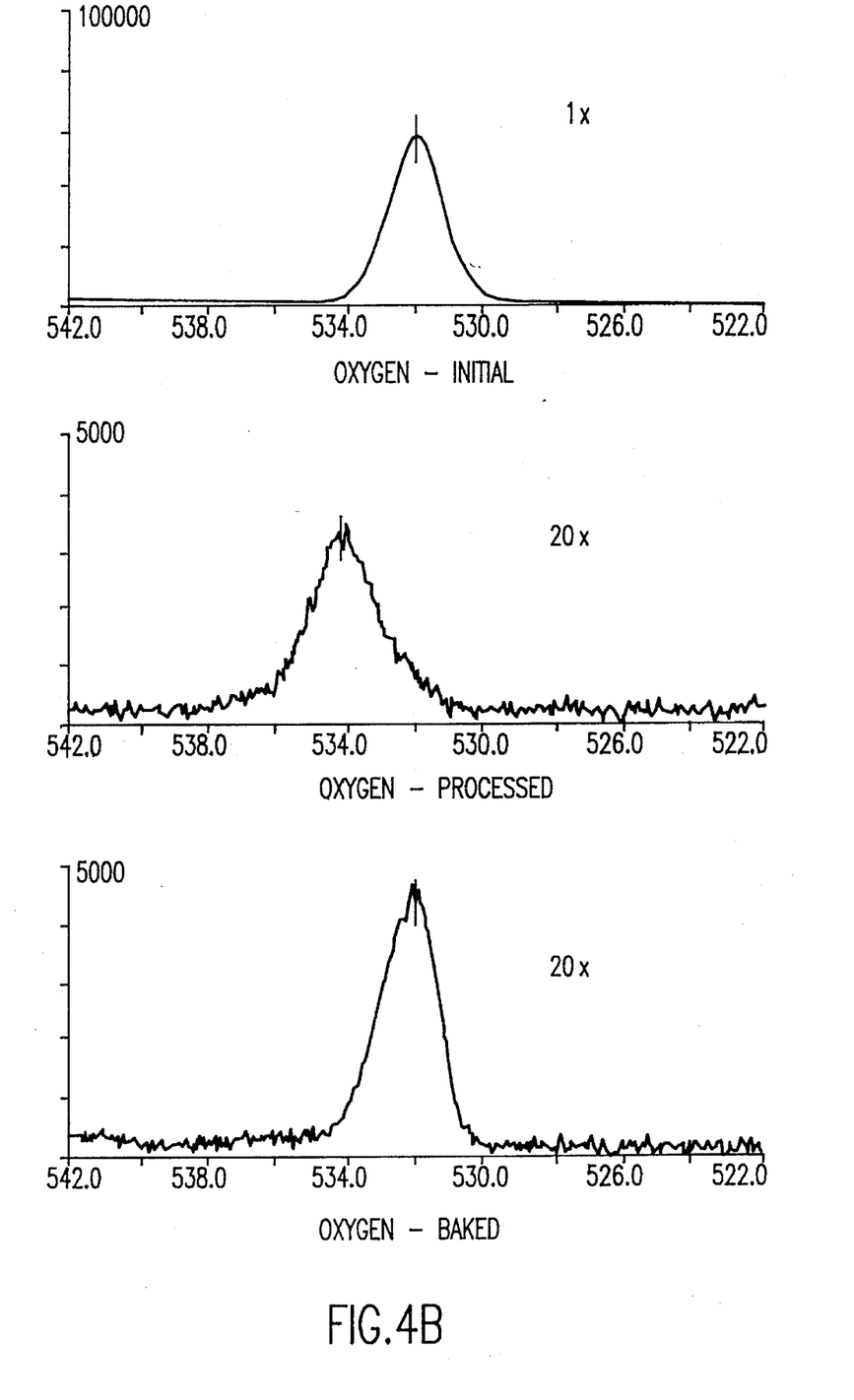
Figure 4C:
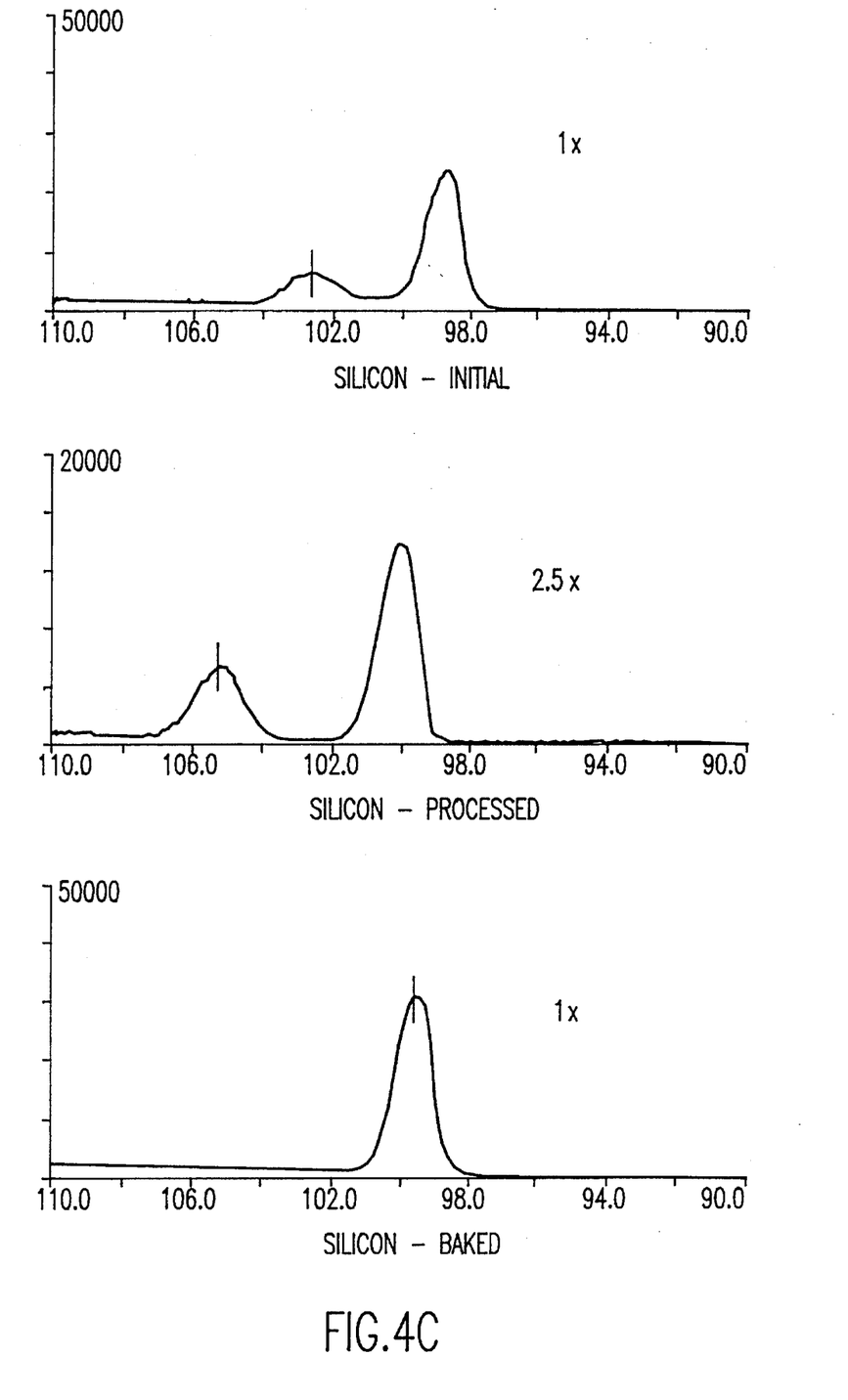

The effective removal of a native oxide has been demonstrated using XPS analysis, with an example of the results shown in FIG. 4. The initial surface of the substrate was cleaned using the RCA or Huang process and the substrate was characterized as containing silicon, oxygen, fluorine and nitrogen in the respective ratio of 58.72:37.56:0.49:0. The oxygen peak 70 is characteristic of silicon dioxide. Following the reaction of the $NH_4F^+$ with the $SiO_2$ layer, the ratio of Si, O, F, and N in the surface was 27.66:2.96:48.46:9.44, respectively. After the removal of the AHFS by baking or rinsing, the surface contained Si, O, F and N in the ratio of 68.51:6.08:3.94:1.03. This graph shows an oxygen peak which is characteristic of subsurface oxygen.

Figure 5A:
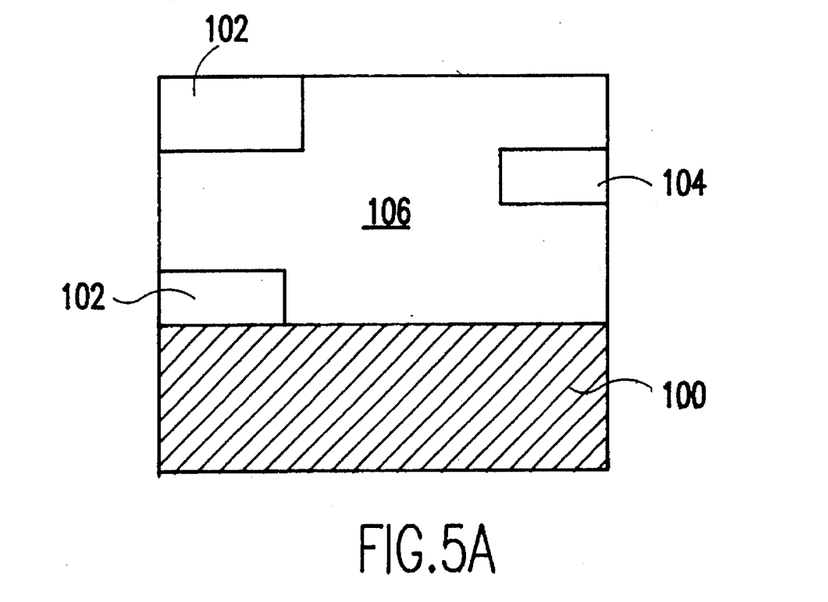
FIGS. 5A and 5B illustrate a selective silicon dioxide etch.
Figure 5B:
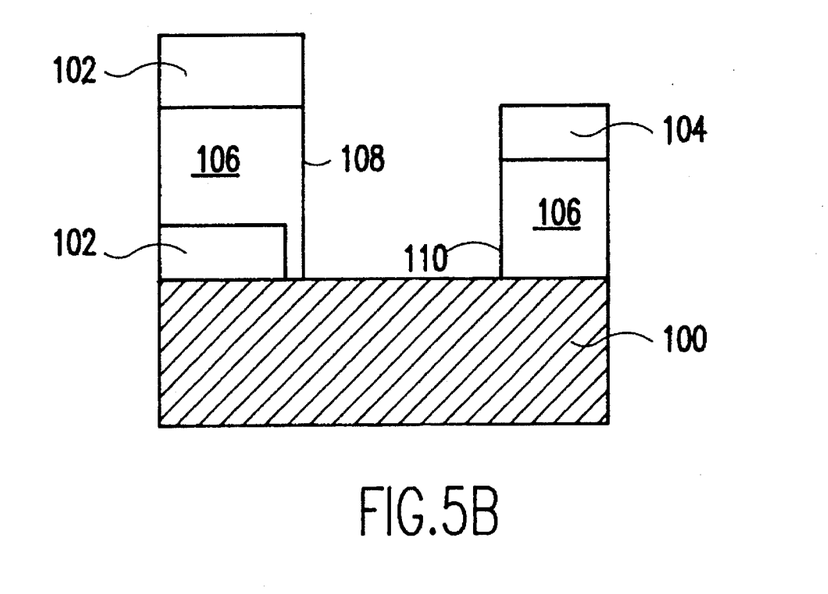

FIGS. 5A and 5B further illustrate the selective etching effect of this invention. FIG. 5A illustrates a substrate 100 with deposits of silicon nitride ($SiN_4$) 102 and polysilicon (Si) 104 and a film of silicon dioxide ($SiO_2$). The ions supply energy to the surfaces which are parallel to the sheaths thus causing the reaction to be anisotropic.

FIG. 5B shows the substrate after it has been etched. The charged particles etch the substrate in only one direction. The exposed surface of $SiO_2$ has been etched down to substrate surface 112. In addition, the $SiO_2$ has been etched to the surface of the polysilicon 104. Furthermore, walls 108 and 110, respectively beneath $Si_3N_4$ 102 and polysilicon 104 have not been undercut during the etch process. The process disclosed in this invention etches only the $SiO_2$ which is exposed on the upper surface of the substrate.

The selective etching of the silicon dioxide with respect to silicon and silicon nitride, using the direct activation technique discussed supra, also provides a means whereby a thermal oxide is non-selectively etched with respect to a deposited oxide. This method has produced the etch rates of 50 for thermal oxide, 60 for PECVD TEOS oxide and 56 PECVD PSG relative to the etch rate of polysilicon. The consistency of the etch rates among these different types of oxides is desirable.

While the invention has been described in terms of its preferred embodiments, those skilled in the art will recognize that the invention can be practiced with modification within the spirit and scope of the appended claims.

Having thus described our invention, what we claim as new and desire to secure by Letters Patent is as follows:

1. A method of producing a silicon dioxide free surface, comprising the steps of:

placing a substrate with a silicon dioxide layer in a chamber, said substrate including an etch stop layer which is selected from the group consisting of silicon nitride and polysilicon;

generating a plasma of reactive radicals from a gas mixture, said generating occurring in said chamber; and exposing said silicon dioxide layer on said substrate to said plasma for a sufficient length of time wherein a portion of said silicon dioxide layer forms product layers containing ammonium hexafluorosilicate whereby said step of generating said plasma in said chamber produces enhanced etching anisotropy during said step of exposing in comparison to exposing said substrate to a plasma generated remotely from said chamber, and wherein said silicon nitride and polysilicon layers are substantially affected than said oxide layer.

2. A method of etching an oxide layer, comprising the steps of:

forming an oxide layer on a substrate;

positioning said substrate within a chamber;

generating, in said chamber, a plasma of reactive radicals from a gas mixture selected from the group consisting of the combination of $NH_3$ and $NF_3$ and the combination of $CF_4$, $O_2$, $H_2$ and $N_2$;

exposing said oxide layer to said plasma for an amount of time to form a removable product layer, said step of exposing being performed independent of a process used in said forming step and proceeding at the same rate for oxide layers formed by different processes during said forming step.

3. A method, as recited in claim 2, wherein said step of forming is performed by a process selected from the group consisting of thermally growing oxides and depositing tetraorthosilicate oxide and depositing phosphosilicate glass.

4. A method, as recited in claim 2, further comprising the step of removing said removable product layer.

5. A method, as recited in claim 4, wherein said step of removing said product layers includes baking at a temperature greater than 100° C.

6. A method, as recited in claim 4, wherein said step of removing said product layers includes rinsing in water.

7. A method of non-selectively etching silicon dioxides, comprising the step of:

exposing a substrate with at least two different oxide types to reactive radicals, said oxide types being selected from the group consisting of thermal oxides and deposited oxides, whereby said exposing consumes said oxide types at a substantially equal rate, the consumed oxides forming product layers.

8. A method of non-selectively etching oxides, comprising the step of:

exposing a substrate with at least two different oxide types to reactive radicals, said oxide types being selected from the group consisting of thermal oxides and deposited oxides, whereby said exposing consumes said oxide types at a substantially equal rate, the consumed oxides forming product layers, and wherein said reactive radicals are formed by exciting a gas mixture selected from the group consisting of the combination of $NH_3$ and $NF_3$ and the combination of $CF_4$, $O_2$, $H_2$ and $N_2$, whereby said exposing consumes said oxide types at a substantially equal rate, the consumed oxides forming product layers.

9. A method of non-selectively etching oxides, comprising the steps of:

exposing a substrate with at least two different oxide types to reactive radicals, said oxide types being selected from the group consisting of thermal oxides and deposited oxides, whereby said exposing consumes said oxide types at a substantially equal rate, the consumed oxides forming product layers; and removing said product layers.

10. A method, as recited in claim 9, wherein said step of removing said product layers includes rinsing in water.

11. A method, as recited in claim 9, wherein said step of removing said product layers includes baking at a temperature greater than 100° C.

12. A method, as recited in claim 8, further comprising the step of removing said product layers.

13. A method, as recited in claim 12, wherein said step of removing said product layers includes baking at a temperature greater than 100° C.

14. A method, as recited in claim 12, wherein said step of removing said product layers includes rinsing in water.

15. A method, as recited in claim 7, further comprising the step of removing said product layers.

* * * * *